(12) United States Patent
Choutov et al.

(10) Patent No.: US 8,598,797 B2
(45) Date of Patent: Dec. 3, 2013

(54) LED DRIVER FOR DRIVING LED LIGHTING DEVICE AT HIGH FREQUENCY

(75) Inventors: Dmitri A. Choutov, Sunnyvale, CA (US); Leonard S. Livschitz, San Ramon, CA (US)

(73) Assignee: Luxera, Inc., Fremont, CA (US)

(*) Notice: Subject to any disclaimer, the term of this patent is extended or adjusted under 35 U.S.C. 154(b) by 324 days.

(21) Appl. No.: 13/109,297

(22) Filed: May 17, 2011

(65) Prior Publication Data

US 2011/0285302 A1 Nov. 24, 2011

Related U.S. Application Data

(60) Provisional application No. 61/345,990, filed on May 18, 2010.

(51) Int. Cl.
*H05B 37/02* (2006.01)
(52) U.S. Cl.
USPC ............................ 315/207; 315/224; 315/291
(58) Field of Classification Search
None
See application file for complete search history.

(56) References Cited

U.S. PATENT DOCUMENTS

| | | | |
|---|---|---|---|
| 6,008,102 A | 12/1999 | Alford et al. | |
| 6,778,058 B1 | 8/2004 | Branchevsky | |
| 2002/0047768 A1* | 4/2002 | Duffy | 336/145 |
| 2004/0095081 A1* | 5/2004 | Kernahan | 315/307 |

OTHER PUBLICATIONS

O'Donnell et al., "Microfabricated Inductors for 20MHz Dc-Dc Converters," Applied Power Electronics Conference and Exposition, 2008, Twenty-Third Annual IEEE: pp. 689-693, IEEE Computer Society.

Wang et al., "Thin Film Microtransformer Integrated on Silicon for Signal Isolation," IEEE Transactions on Magnetics, vol. 43, No. 6, Jun. 2007.

* cited by examiner

*Primary Examiner* — Crystal L Hammond

(57) ABSTRACT

A driver device for driving an LED lighting device includes at least one power switch adapted to operate at a switching frequency of greater than 500 KHz and adapted to control the driving current provided to the LED lighting device. Operating the power switch at such a high frequency allows a substantial reduction in passive devices such as inductors and capacitors.

21 Claims, 6 Drawing Sheets

LED DRIVER FOR DRIVING LED LIGHTING DEVICE AT HIGH FREQUENCY

CROSS REFERENCE TO RELATED APPLICATIONS

This application claims the benefit of priority under 35 U.S.C. Section 119(e) to U.S. Provisional Application Ser. No. 61/345,990, filed May 18, 2010, entitled "Apparatus and Method for Operating a Light Emitting Diode Lighting Device at High Frequency", which is fully incorporated by reference herein.

FIELD OF THE INVENTION

The present invention is related generally to the field of electronic devices. More particularly, the present invention is related to the field of electronics for light emitting diode lighting applications.

BACKGROUND OF THE INVENTION

An operating Light Emitting Diode (LED) lighting device requires an energy efficient and cost effective electronic driver circuit. Currently, the most common solution is to apply pulse width modulation (PWM) to LED lighting devices to generate constant forward current and to control brightness by adjusting PWM duty cycle with a number of available options such as, among others, buck, buck-boost, flyback, and SEPIC (Single Ended Primary Inductor Converter) and other topologies.

While the PWM principle has been well known for decades, an off line LED driver (driver that receive power from a household power line which ranges from 100 volts to 230 volts rms) application presents a particular challenge due to high switching voltages (e.g., 170V-330V peak-to-peak depending on line voltage and driver topology). Regardless of topology, an LED driver utilizes a power switch such as a power FET (Field Emission Transistor) to control the driving current provided to the LED lighting devices. Switching losses for such power FET are proportional to PWM frequency parasitic capacitance and a square of voltage. In addition to FET parasitic capacitance, diode reverse recovery losses increase with high frequency as well. Since a higher switching voltage increases the losses dramatically, a low PWM frequency is typically used with conventional switching components. A typical off line LED driver uses PWM frequency in a range between 50 KHz and 150 KHz.

However, using such a low PWM frequency requires high value passive components, such as capacitors and inductors. High value passive components present a number of drawbacks such as high cost, large size, and high parasitics. In some applications high value/high voltage capacitors can be only of electrolytic type to meet cost requirements. However, electrolytic capacitors are particularly unsuitable for off line retrofit LED lighting because of reduced lifetime at high temperature, which is far shorter than the expected lifetime of 50,000 hours for an LED source.

Thus, it would be desirable to provide a high voltage LED driver circuit which provides highly efficient switching and yet has low cost, reduced size, low parasitic resistance and high reliability. It would be also desirable to provide such an LED driver circuit in a compact advanced packaging to further improve LED driver efficiency.

SUMMARY OF THE DISCLOSURE

According to one aspect of the present invention, a driver device for driving an LED lighting device is provided. The driver device includes at least one power switch adapted to operate at a switching frequency of greater than 500 KHz and adapted to control the driving current provided to the LED lighting device. An LED controller circuit is coupled to the power switch and is operable to control the switching of the power switch. Operating the power switch at such a high frequency allows a substantial reduction in passive devices such as inductors and capacitors.

In one embodiment, the power switch is made from a material having a band gap of greater than 1.2 eV. This allows the driver device to be operated at a high frequency with low switching loss.

BRIEF DESCRIPTION OF THE DRAWINGS

The present invention is illustratively shown and described in reference to the accompanying drawings, in which.

DETAILED DESCRIPTION OF THE INVENTION

Figure 1:
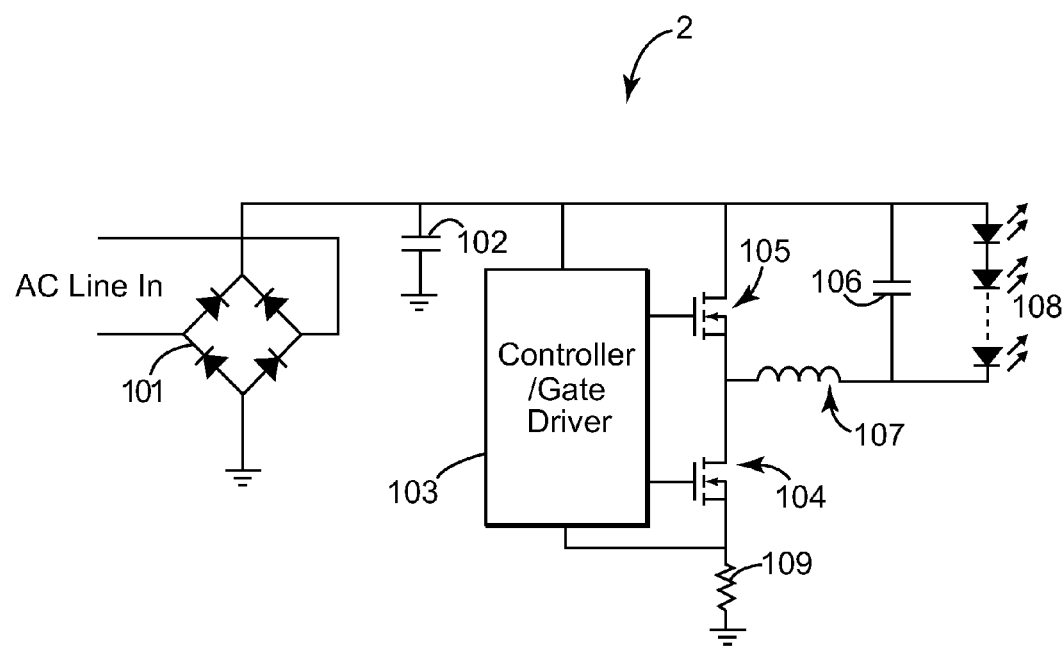
FIG. 1 is a block diagram of an AC/DC LED driver according to an embodiment of the present invention.

As used herein, the components of an LED driver can be divided into two distinctive types: i) power devices and ii) control devices. Power devices are defined as electronic devices that are used to deliver power to other devices, components, and modules. Control devices are devices that sense, amplify, and convert signals to monitor and to control the power devices.

Briefly, the present invention substantially reduces switching losses and reduces the values and size of passive components, such as capacitors and inductors. The present invention also implements capacitors and inductors as devices that are integrated together on a common substrate, as opposed to discrete components on a PCB. In one embodiment, the present LED driver replaces a PCB with an inorganic substrate with improved matching and higher thermal conductivity. The present invention utilizes parallel processing of multiple components. As a result, as higher level of integration removes cost and space constraints and improves reliability.

In one embodiment, the electronic components of the LED driver of the present invention are encapsulated into an organic substrate. An inductor is formed within the same organic substrate as an integrated part of the substrate. The electronic components are connected by means of patterned copper and aluminum metals, or solderless metals and metal alloys.

In another embodiment, electronic components of the LED driver is formed inside an inorganic substrate such as a silicon substrate and electronic components including active devices constructed of wide-bandgap semiconductors are attached to the silicon substrate. An inductor is formed within the same silicon substrate as an integrated part of said substrate. The electronic components are connected to each other by means of patterned copper, aluminum and tungsten metals or alloys thereof.

The present invention also provides a method for constructing a driver for operating an LED lighting device. The method comprises forming or placing electronic components including active devices constructed of wide-bandgap semiconductors over or within a silicon substrate. A 3-dimensional inductor is formed on or within the same silicon substrate as an integrated part of the substrate by using a part of the electrical trace of the substrate as a part of the windings of the inductor. The electronic components are connected by means of patterned copper and aluminum metals.

According to one aspect of the present invention, an LED driver is provided with one or more power switches that are capable of operating at high current (e.g., 500 mA) and high frequency (i.e., greater than 500 KHz and preferably greater than 1 MHz) and at high voltage (i.e., greater than 24 volts) to control the driving current provided to the LED lamps. When operating at such high frequency, the present invention allows smaller inductors and capacitors to be incorporated into a driver circuit while at the same time providing low switching loss. In one embodiment, the power switches are made with materials that have a wide-bandgap (i.e., greater than 1.2 eV).

Examples of wide-bandgap materials includes, but are not limited to, Silicon Carbide (SiC), Gallium Nitride (GaN), Gallium Arsenide (GaAs) and Indium Phosphide (InP). Herein, wide-bandgap material is defined as a material having the gap between the valence and conducting zone of more than 1.2 eV.

An LED lamp driver of the present invention can be, but is not limited to, a synchronous buck topology. One example of a synchronous buck off line LED lamp driver 2 for an LED lighting device such as LED lamps 108 is shown in FIG. 1. With reference to FIG. 1, AC line voltage (e.g., 220 volts rms) is rectified by rectification bridge 101 and input capacitor 102; controller/gate driver IC (Integrated Circuit) 103 drives the gates of power switches 104 and 105 which are connected in series with each other and which control the driving current provided to the LED lamps 108. The power switches have been adapted to operate at high frequency (i.e., greater than 500 KHz) with low loss. According to one embodiment of the invention, the power switches 104 and 105 are wide-bandgap power FET switches. The switches 104 and 105 operate synchronously to control the PWM signal. The capacitor 106 and inductor 107 work with the switches 104 and 105 to deliver driving current to LED lamps 108. Voltage drop at sense resistor 109 is used to measure and control the desired current through LED lamps 108.

The rectifier 101, FET switches 104 and 105, output capacitor 106 and inductor 107 are power devices while control devices include input capacitor 102, sensor 109 and controller 103. The output capacitor 106 typically has a capacitance value greater than 100 pF. The inductor 206 typically has an inductance value greater than 1 nH.

In case of a high frequency application (i.e., greater than 500 KHz and preferably greater than 1 MHz), a freewheeling diode switch, which replaces the FET switch 105, can be made of a wide-bandgap material to reduce reverse recovery losses. However, wide-bandgap diode typically has higher forward voltage than conventional silicon diode. Therefore the use of synchronous wide-bandgap FET switch 105 is desirable to reduce both forward voltage loss and reverse recovery loss. Controller 103 turns off switch 105 when switch 104 is on, and turns on switch 105 when switch 104 is off to alternately store electrical energy in the inductor 107 deliver the stored energy to the LED lamps 108 in a known manner.

In an alternative embodiment, the driver 2 shown in FIG. 1 can operate from DC power supply. In this case the rectifier (rectification bridge) 101 is not required.

FIG. 1 shows a buck converter topology suitable for applications when supply voltage is greater than forward voltage of LEDs. In addition to buck and depending on supply voltage, a number of topologies including boost, flyback, SEPIC and others can be used. The present invention provides for a high frequency LED driver using wide-bandgap power switches and does not depend on a particular topology of voltage converter.

The LED driver 2 of FIG. 1 with or without the rectifier 101 can be assembled on a conventional organic substrate such as a printed circuit board (PCB).

Compared to conventional off-line LED driver, the driver 2 of FIG. 1 provides the following distinctive differences and advantages: i) utilizes wide-bandgap semiconductor materials for power FET switches 104 and 105, ii) operates at PWM frequencies of at least 500 KHz and preferably at 1 MHz or greater; iii) reduces switching losses to achieve an efficiency greater than 75% at PWM frequencies of over 500 KHz, iv) enables the use of much smaller, cheaper, and more reliable capacitor 106 and inductor 107 of FIG. 1.

As an example, the size of an exemplary inductor for a driver operating at the PWM frequency of 100 KHz may be 12 mm×12 mm×10 mm and have an inductance of 1 mH. However, when the driver is operated at the PWM frequency of 1 MHz by using the wide-bandgap FET switches of the present invention, the inductance required is one tenth the size because the inductance (i.e., 0.1 mH) and hence the size of the inductor is inversely proportional to the PWM frequency. Accordingly, the inductor size can be reduced down to 1.2 mm×1.2 mm×1 mm.

Assembling method of surface mount components on a conventional PCB used in FIG. 1 can be further improved: i) by reducing the number of solder joints to improve reliability and ii) by using packageless components to reduce cost. Hereinafter, this method of assembly will be referred to as "solderless" and "packageless".

Solder is defined as Tin or Tin alloys. Thus, the term "solderless" means without Tin or Tin alloys. The term "packageless" means only the active silicon substrate and the interconnects are present, whereas an external packaging, such as plastic, ceramic, or solder bump, are not present.

Passive devices such as capacitors 102, 106, and resistor 109 in FIG. 1 can be integrated on a monolithic substrate as an Integrated Passive Device (IPD) chip. In addition to devices 102, 106, and 109, IPD chip may incorporate a number of additional capacitors and resistors that may be required for filtering, protection, and other functions inside LED driver. Furthermore, active devices such as rectifier 101 and FET switches 104 and 105 in FIG. 1 can be integrated on a monolithic substrate as an Integrated Active Device (IAD) chip. Besides devices 101, 104, and 105, IAD chip may incorporate a number of additional diodes and transistors that may be required for regulation, dimming, protection, and other functions inside LED driver. A more detailed description of incorporating IAD and IPD chips is in U.S. application entitled "Integrated Electronic Device for Controlling Light Emitting Diodes", U.S. Ser. No. 13/018,159, filed Jan. 31, 2011, which is incorporated herein by reference. IAD chip may contain devices fabricated from Silicon semiconductor material, wide-bandgap semiconductor material, or combination of thereof.

FIGS. 2A-2F are a set of cross-sectional diagrams illustrating an integrated LED driver fabrication method according to the present invention.

Figure 2A:
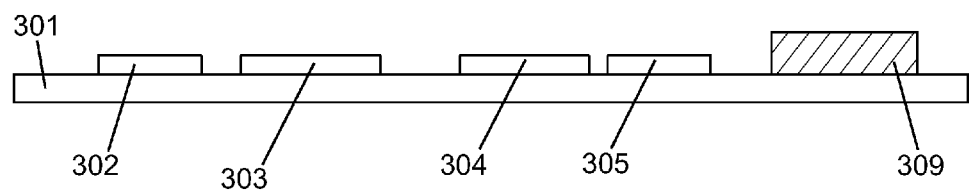
FIGS. 2A-2F are a set of cross-sectional diagrams illustrating an integrated LED driver fabrication method according to an embodiment of the present invention.

Referring to FIG. 2A, which shows the first step in manufacturing, Silicon IAD chip 302, IPD chip 303, wide-bandgap IAD chip 304, Controller IC 305, and magnetic core 309 are attached to organic substrate such as an FR4 PCB substrate 301. Here, Silicon IAD chip comprises rectification bridge diodes 101 and, optionally low-frequency control circuits. Wide-bandgap IAD chip contains one or more wide-bandgap power FET switches and/or diodes shown as 104, and 105 in FIG. 1. IPD chip 303 replaces capacitors 102, 106, and resistor 109 in discrete designs in FIG. 1.

According to another aspect of the present invention, a 3-dimensional inductor 300 (see FIG. 2E) containing the magnetic core 309 is integrally formed with the substrate 301 such that a compact LED driver package can be provided. In some embodiments, the entire LED driver circuit may be provided in a single low profile driver package. The magnetic core 309 material of the inductor 300 has high magnetic permeability, for example but not limited to ferrite material or a Nickel-Iron alloy. High permeability is defined as 10 or above relative to the permeability of vacuum being one. In case of a conductive material such as Nickel-Iron, the magnetic core should be layered with individual layers isolated from each other to prevent losses from Eddie currents. In case of a non-conductive material such as ferrite, layering is not required.

Another method of preventing losses in conductive core due to induced currents is to break the magnetic material in sufficiently small particles and mix these particles in isolating medium, such as oxide or an organic polymer. Same isolating medium can be used as glue that holds magnetic particles together. Thus, the magnetic core 309 can be any type of medium such as oxide, glass, dielectric, polymer or ceramic material containing magnetic particles. This type of magnetic core can be pre-formed and inserted into cavity in the substrate. Alternatively, a plyable mixture of magnetic particles and insulating polymer can be applied to the substrate through a silk screen and subsequently cured.

Figure 2B:
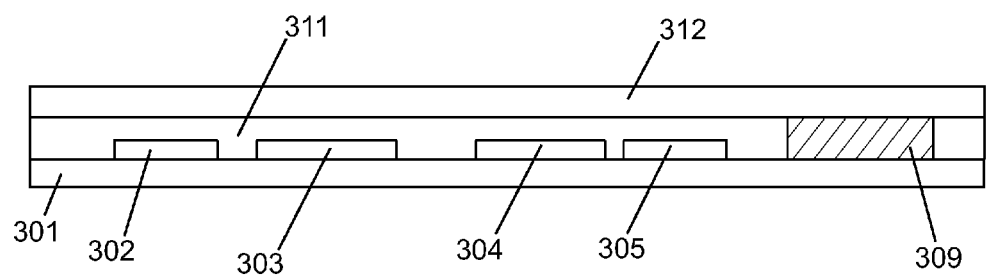

In the next step of fabrication shown in FIG. 2B, devices 302, 303, 304, 305, and 309 (further referred to as "embedded devices") are covered by a sheet 311 of bonding material which has been pre-impregnated with bonding compound, such as epoxy resin, commonly known as "Prepreg". This prepreg sheet has pre-cut openings to accommodate embedded devices. If one imbedded device is thicker than others, second prepreg sheet may be required to planarize the surface. This structure is further covered by another substrate layer 312 and subjected to thermal treatment to cure bonding material in sheet 311.

Figure 2C:
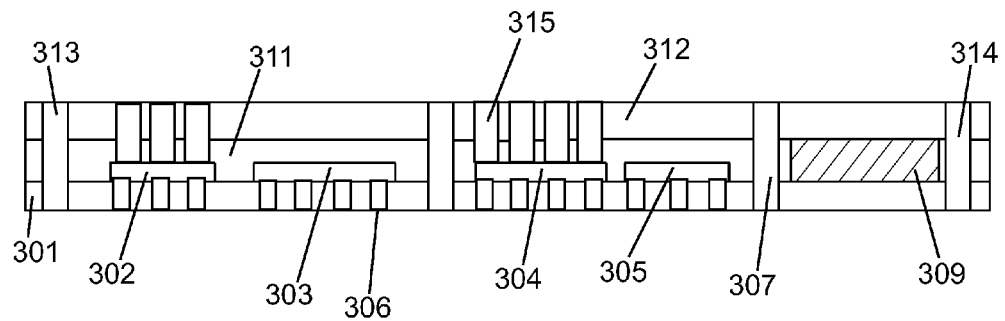
Figure 2D:
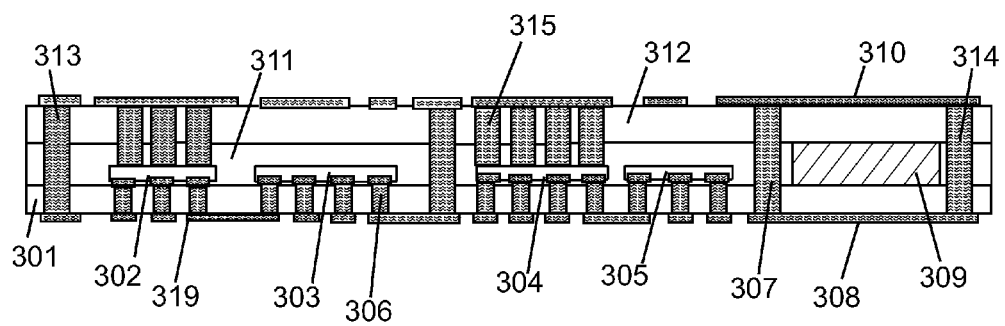

As a next step shown in FIG. 2C, through via holes (or simply vias) 307, 313, 314 and microvia holes (or simply microvias) 306, 315 are formed. The difference between vias and microvias is that vias connect two opposite surfaces of composite structure (substrates) while microvias connect to embedded devices on one end. Typically through via can be formed by mechanical drilling or laser ablation, while microvia are laser formed. In the next step through via and microvia are filled with conductive interconnect material such as copper by means of electroplating as shown in FIG. 2D. Copper deposited to fill microvia may be used to form conductive traces 308, 310, and 319 on both surfaces of the substrates 301 and 312. The methods of forming patterned copper traces on a surface of organic substrates are well known in PCB (Printed Circuit Board) manufacturing and are not discussed in detail. The resulting structure of through via, microvia, and traces connect devices and embedded devices with each other and with external input/output functions. Microvia 315 connected to the back side of embedded devices serve as heat conducting elements as heat conductivity of copper is much greater than conductivity of organic board material.

An integrated inductor 300 is formed by forming a winding using via 307, 314, and traces 310, 308 surrounding magnetic core 309. The inductor 300 is integrated with or integrally formed with the substrate 301. What that means is that: 1) a part of the substrate is also a part of the inductor 300; 2) these common parts are formed together simultaneously; and the inductor is not functional without the substrate. In this instance, a part of the conductive traces 308, 310 for the substrates is used to form a portion of the windings for the inductor 300.

Figure 2E:
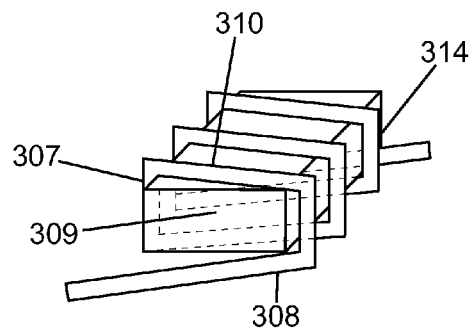
Figure 2F:
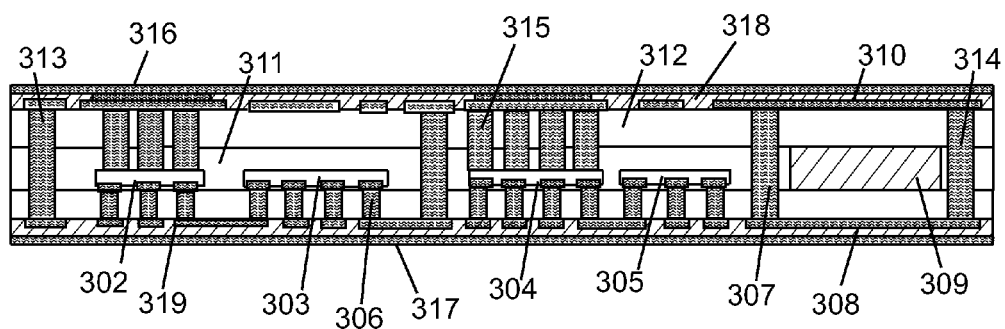

As shown in FIGS. 2D and 2E, the magnetic core 309 has upper, lower, left vertical and right vertical sides. The electrical lines defined by the trace 310, via 307, trace 308 and via 314 are disposed over upper side, left vertical side, lower side and right vertical side, respectively, and define a coil having more than 2 windings. While the magnetic core has been shown as a 3-dimensional rectangular block, the core having other shapes such as cylindrical shape may be used.

These windings can be repeated in direction perpendicular to cross section forming a 3-dimensional inductor 300 as shown in an isometric projection shown in FIG. 2E. Here series of via 307, 314, and traces 308, 310 form multiple windings around core 309. Additional metal (in a not limiting example copper) layers 316 and 317 are formed over top and bottom surface of integrated driver 2 to provide electromagnetic shielding (see FIG. 2F). Shielding layers 316 and 317 are separated from traces by dielectric layers 318 and 319. Shielding layers may be continuous sheets as shown in FIG. 2 or may be shaped as a grid or a mesh. Layers 316 and 317 are also connected to heat sinking elements 315 to further improve heat dissipation. Same layers may be used to further interconnect embedded devices.

Organic substrate 301 in FIG. 2 has several drawbacks: 1) as its sole function is mechanical support and isolation, it cannot be used to construct any electronic devices; 2) thermal conductivity of organic materials is lower than that of inorganic substrate which reduces heat transfer and dissipation; and 3) thermal expansion coefficient of organic material is different from inorganic materials which may cause undesirable stress.

To improve the performance and reliability and to reduce cost, the integrated driver 2 can be implemented on an inorganic substrate 401 as shown in FIG. 4A. Some examples of inorganic materials used for substrate 401 are Silicon, Silicon Carbide, Gallium Nitride, Sapphire or a combination thereof. An example of a substrate with combined materials is a bulk layer of Silicon with a Gallium Nitride layer on top or a bulk Sapphire layer with a Gallium Nitride layer on top.

Figure 3A:
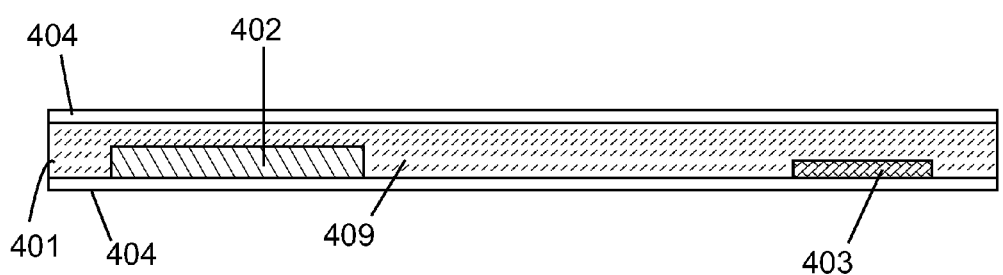
FIGS. 3A-3D are a set of cross-sectional diagrams illustrating an integrated LED driver fabrication method with an active silicon substrate according to an embodiment of the present invention.

With continued reference to FIG. 3A, IPD device 402 containing capacitors and resistors and IAD device 403 containing FET switches and diodes (such as rectifier 101) are formed within the substrate 401 with known semiconductor processing techniques. Further a dielectric layer 404 is formed on front and back surfaces of substrate 401 to isolate subsequently attached devices and interconnect traces from previously formed devices.

Figure 3B:
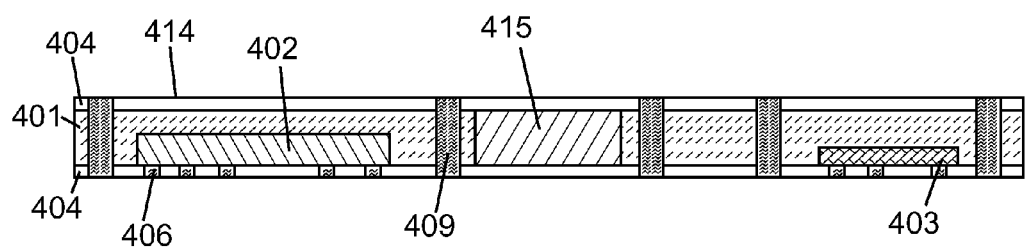

In the next step shown in FIG. 3B, through vias 409 connecting front and back surfaces of the substrates 404 are formed by means of plasma etching. In the same step, a cavity for inductor core is formed and magnetic core 415 is placed or formed inside the substrate 404. Similar to FIG. 2, the magnetic core 415 material has high magnetic permeability, and can be Nickel-Iron alloy or ferrite material, in a not limiting example. The cavity for placement or formation of magnetic core 415 is fabricated together with through vias 409. If a conductive material such as Nickel-Iron is used for magnetic core material, it should be structured as individual layers isolated from each other to prevent losses from Eddie currents. If a non-conductive material such as ferrite is used the layering of magnetic core is not necessary and it can be formed as a continuous block. When the magnetic core 415 is placed inside the cavity it should be pre-fabricated including the layered structure before installation inside the cavity. When the magnetic core is formed by deposition method, the cavity should have slots before deposition of magnetic material. Additional vias 406 are formed to connect pads of devices 402 and 403 to external surface. Vias 406 and 409 are filled with Copper, Copper alloy, tungsten or another suitable conductive material.

Figure 3C:
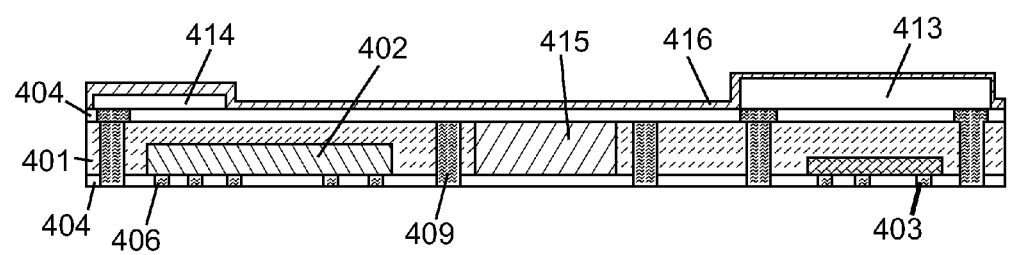

In the next step shown in FIG. 3C, packageless chips containing Silicon IAD devices 414 and wide-bandgap IAD devices 413 are attached to the substrate and connected to the other side of said substrate by means of through vias 409 and covered by dielectric 416.

Figure 3D:
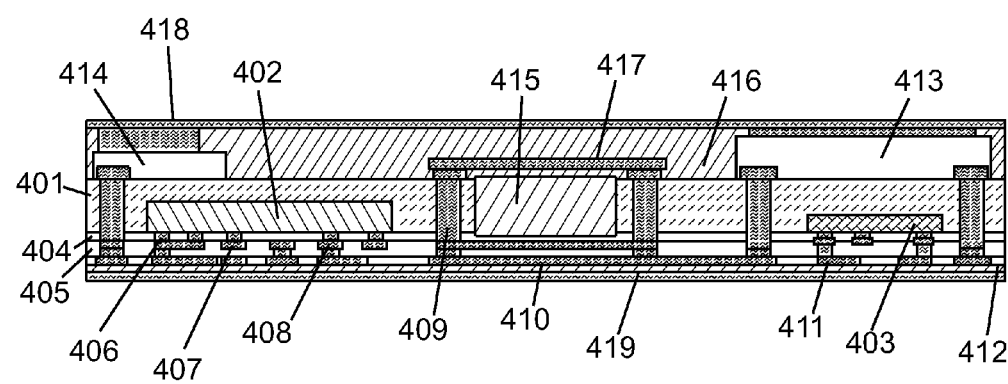

Further, as shown in FIG. 3D, interconnect layer comprising conductive trace lines 407 separated from substrate 401 by dielectric 404 and connected to devices 402 and 403 by via 406 is formed. A second optional interconnect layer can be formed by conductive trace lines 410 and 411 separated by dielectric 405 from first interconnect layer and connected by via 408 to conductive lines 407 of first interconnect layer. The material filling via 406 and 407, and forming conductive lines 407 and 410, can be Copper, Aluminum, Tungsten or an alloy thereof, as non-limiting examples. Preferably, the interconnect material for vias 406, 407 and 409 is tungsten while the material for electrical trace 410 is Aluminum Copper alloy.

Interconnect layers/traces 417, 410, together with through via 409 define a plurality of windings of a coil around magnetic core 415 to make an inductor of similar construction to FIG. 2D. The main difference is that in FIG. 2D the supporting mechanical structure is organic material while in the case of FIG. 3D, the supporting mechanical structure is inorganic material. As in FIG. 2E, by repeating vias 309 and traces 417 and 410 in third dimension, multiple windings are built to achieve greater inductance.

Additional metal (in a non limiting example) layers 418 and 419 are formed over top and bottom surface of the integrated driver 2 to provide electromagnetic shielding. Shielding layers 418 and 419 are separated from interconnect layers by dielectric layers 412 and 416. Shielding layers may be continuous sheets as shown in FIG. 3 or may be shaped as a grid or a mesh. Layers 418 and 419 are also connected to devices 413 and 414 to further improve heat dissipation.

Integration method for each specific component can be flexible and, depending on specific aims of optimization of performance, reliability, and cost, may be implemented as a combination of the driver implantation in FIGS. 2 and 3. For example, some of the components shown in FIG. 2 that are imbedded in between two organic substrates can be attached to the outside of said substrates as a regular SMT component. In another example, inorganic substrate shown in FIG. 3 can be attached to a conventional PCB.

The components within the integrated driver can be moved around as well. For example, components in FIG. 3 formed within inorganic substrate can be fabricated as packageless chips and attached to the substrate, and vise versa—devices formed within the substrate can be moved outside as attached components.

Accordingly, the foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

What is claimed is:

1. A driver device for driving an LED lighting device comprising:
    at least one power switch capable of handling a peak-to-peak voltage of at least 170V, and adapted to operate at a switching frequency of greater than 500 KHz and adapted to control the driving current provided to the LED lighting device;
    a LED controller circuit coupled to the power switch and operable to control the switching of the power switch.

2. The driver device of claim 1, wherein the power switch includes a power transistor having a band gap of greater than 1.2 eV.

3. The driver device of claim 2, wherein at least a portion of the power switch is made of Gallium Nitride (GaN).

4. The driver device of claim 2, wherein at least a portion of the power switch is made of Gallium Arsenide (GaAs).

5. The driver device of claim 2, wherein at least a portion of the power switch is made of Indium Phosphide (InP).

6. The driver device of claim 2, further comprising a rectifier and wherein the power switch and the rectifier are attached to a monolithic substrate.

7. The driver device of claim 6, wherein the rectifier is part of an integrated active device (IAD) chip.

8. The driver device of claim 2, further comprising a capacitor having a capacitance value greater than 100 pF and wherein the power switch and the capacitor are attached to a monolithic substrate.

9. The driver device of claim 8, wherein the capacitor is part of an integrated passive device (IPD) chip.

10. The driver device of claim 2, further comprising an inductor having an inductance value greater than 1 nH and wherein the power switch and the inductor are attached to a monolithic substrate.

11. The driver device of claim 2, wherein the power switch includes at least one n-channel FET.

12. The driver device of claim 2, wherein the power switch includes a first power switch and a second power switch connected in series with the first power switch.

13. A driver device for driving an LED lighting device comprising:
    at least one power FET switch having a bandgap of greater than 1.2 eV and adapted to control the driving current provided to the LED lighting device; and
    a LED controller circuit couple to the power FET switch and operable to control the switching of the power FET switch.

14. The driver device of claim 13, wherein at least a portion of the power switch is made of Gallium Nitride (GaN), Gallium Arsenide (GaAs) or Indium Phosphide (InP).

15. The driver device of claim 13, further comprising a rectifier and wherein the power FET switch and the rectifier are attached to a monolithic substrate.

16. The driver device of claim 15, wherein the rectifier is part of an integrated active device (IAD) chip.

17. The driver device of claim 13, further comprising a capacitor having a capacitance value greater than 100 pF and wherein the power FET switch and the capacitor are attached to a monolithic substrate.

18. The driver device of claim 17, wherein the capacitor is part of an integrated passive device (IPD) chip.

19. The driver device of claim 13, further comprising an inductor having an inductance value greater than 1 nH and wherein the power FET switch and the inductor are attached to a monolithic substrate.

20. The driver device of claim 13, wherein the power FET switch includes at least one n-channel FET.

21. The driver device of claim 13, wherein the power FET switch includes a first power FET switch and a second FET power switch connected in series with the first power FET switch.

* * * * *